US007982331B2

(12) United States Patent
Murray et al.

(10) Patent No.: US 7,982,331 B2
(45) Date of Patent: Jul. 19, 2011

(54) TRANSFER SWITCH ASSEMBLY

(75) Inventors: Jerry Murray, Center City, MN (US); Allen B. Carney, Vadnals Heights, MN (US); Randall L. Bax, Andover, MN (US); Elias Ayana, St. Paul, MN (US); Roger Pautzke, Watertown, MN (US); John McCarthy, Plymouth, MN (US)

(73) Assignee: Cummins Power Generation IP, Inc., Minneapolis, MN (US)

( * ) Notice: Subject to any disclaimer, the term of this patent is extended or adjusted under 35 U.S.C. 154(b) by 434 days.

(21) Appl. No.: 12/005,674

(22) Filed: Dec. 28, 2007

(65) Prior Publication Data

US 2008/0158785 A1    Jul. 3, 2008

Related U.S. Application Data

(60) Provisional application No. 60/877,969, filed on Dec. 29, 2006.

(51) Int. Cl.
*B60L 1/00* (2006.01)
*B60L 3/00* (2006.01)
*H02G 3/00* (2006.01)

(52) U.S. Cl. ........... 307/9.1; 165/185; 257/726; 307/64; 307/65; 307/66; 307/70; 307/85; 307/86; 307/87; 361/704; 361/719; 361/752; 361/753; 361/819; 361/837; 439/74; 439/554; 439/188

(58) Field of Classification Search ................... None
See application file for complete search history.

(56) References Cited

U.S. PATENT DOCUMENTS

| 3,571,693 | A |  | 3/1971 | Riaz |
| 4,063,162 | A |  | 12/1977 | Lanz et al. |
| 4,208,693 | A |  | 6/1980 | Dickens et al. |
| 4,245,182 | A |  | 1/1981 | Aotsu et al. |
| 4,262,212 | A |  | 4/1981 | Jacob et al. |
| 4,443,828 | A |  | 4/1984 | Legrand et al. |
| 4,574,340 | A |  | 3/1986 | Baker |
| 4,589,052 | A |  | 5/1986 | Dougherty |
| 4,661,769 | A |  | 4/1987 | Girgis |
| 4,728,806 | A |  | 3/1988 | Baker et al. |
| 4,835,405 | A |  | 5/1989 | Clancey et al. |
| 4,855,664 | A |  | 8/1989 | Lane |
| 4,912,382 | A |  | 3/1990 | Koenig et al. |
| 4,996,646 | A |  | 2/1991 | Farrington |
| 5,006,781 | A |  | 4/1991 | Schultz et al. |
| 5,028,804 | A |  | 7/1991 | Lauw |
| 5,029,120 | A |  | 7/1991 | Brodeur et al. |
| 5,117,174 | A |  | 5/1992 | Kessler |
| 5,168,208 | A |  | 12/1992 | Schultz et al. |
| 5,305,185 | A | * | 4/1994 | Samarov et al. ............... 361/704 |

(Continued)

FOREIGN PATENT DOCUMENTS

WO    WO 2005/046044 A1    5/2005

(Continued)

*Primary Examiner* — Jared J Fureman
*Assistant Examiner* — Justen Fauth
(74) *Attorney, Agent, or Firm* — Krieg DeVault LLP; J. Bruce Schelkopf; L. Scott Paynter (57) ABSTRACT

A transfer switch assembly is disclosed that includes a power switch device with a number engagement landings and a printed circuit board defining an opening bordered by a number of tabs. The tabs engage the landings as the switch device extends through the openings, and can be fastened together.

22 Claims, 7 Drawing Sheets

U.S. PATENT DOCUMENTS

| | | | |
|---|---|---|---|
| 5,315,229 A | 5/1994 | Markus | |
| 5,390,068 A | 2/1995 | Schultz et al. | |
| 5,406,495 A | 4/1995 | Hill | |
| 5,433,175 A | 7/1995 | Hughes et al. | |
| 5,587,647 A | 12/1996 | Bansal et al. | |
| 5,587,917 A | 12/1996 | Elms | |
| 5,592,021 A | 1/1997 | Meschter et al. | |
| 5,592,393 A | 1/1997 | Yalla | |
| 5,701,070 A | 12/1997 | Schultz | |
| 5,784,267 A | 7/1998 | Koenig et al. | |
| 5,890,097 A | 3/1999 | Cox | |
| 5,909,656 A | 6/1999 | Yang | |
| 6,037,768 A | 3/2000 | Moulder et al. | |
| 6,038,267 A | 3/2000 | Oura et al. | |
| 6,088,226 A | 7/2000 | Rearick | |
| 6,125,036 A * | 9/2000 | Kang et al. | 361/700 |
| 6,144,092 A | 11/2000 | Kappes et al. | |
| 6,173,216 B1 | 1/2001 | Vu et al. | |
| 6,194,656 B1 * | 2/2001 | Kondo et al. | 174/535 |
| 6,392,371 B1 | 5/2002 | Cheng et al. | |
| 6,483,708 B2 | 11/2002 | Ali et al. | |
| 6,541,991 B1 * | 4/2003 | Hornchek et al. | 324/755 |
| 6,545,870 B1 | 4/2003 | Franke et al. | |
| 6,549,410 B1 | 4/2003 | Cohen | |
| 6,654,250 B1 | 11/2003 | Alcoe | |
| 6,765,157 B2 | 7/2004 | Rademacher et al. | |
| 6,775,141 B2 * | 8/2004 | Yoshida et al. | 361/719 |
| 6,782,941 B2 | 8/2004 | Lee | |
| 6,801,019 B2 | 10/2004 | Haydock et al. | |
| 6,955,543 B2 * | 10/2005 | Messina et al. | 439/73 |
| 6,965,818 B2 | 11/2005 | Koenig et al. | |
| 6,969,922 B2 | 11/2005 | Welches et al. | |
| 6,972,972 B2 | 12/2005 | Duncan et al. | |
| 6,984,897 B2 | 1/2006 | Skeist et al. | |
| 6,994,360 B2 | 2/2006 | Kuang et al. | |
| 7,002,259 B2 | 2/2006 | Howes et al. | |
| 7,034,427 B2 | 4/2006 | Hirzel | |
| 2002/0030977 A1 * | 3/2002 | Grant et al. | 361/760 |
| 2002/0044422 A1 | 4/2002 | Bailey et al. | |
| 2004/0057212 A1 | 3/2004 | Russell et al. | |
| 2004/0084965 A1 * | 5/2004 | Welches et al. | 307/64 |
| 2006/0109701 A1 | 5/2006 | Morcov et al. | |

FOREIGN PATENT DOCUMENTS

| | | |
|---|---|---|
| WO | WO 2006/090111 A2 | 8/2006 |

* cited by examiner

Fig. 7

TRANSFER SWITCH ASSEMBLY

CROSS-REFERENCE TO RELATED APPLICATIONS

The present application claims the benefit of U.S. Provisional Patent Application No. 60/877,969 filed on 29 Dec. 2006, which is hereby incorporated by reference herein in its entirety.

BACKGROUND

The present invention relates generally to electrical power systems, and more particularly, but not exclusively, to a multicomponent transfer switch assembly for an electric power generation application.

In various applications, it may be desirable to accommodate switching between alternative sources of electrical power. For example, some vehicles include an on-board power generation system and an interface to receive power from a source external to the vehicle sometimes called "shore" power. Thus, to service electrical loads of the vehicle it is desirable to provide a power transfer switch device to switch between the external source and the on-board generation system. Such devices may include a range of electronic components, and thermal dissipation often figures significantly into the engineering design of such devices. Also, there is a frequent desire to minimize space occupied by the device, which can compete with thermal performance considerations. Indeed, there is an ongoing demand for further contributions in this area of technology.

SUMMARY

One embodiment of the present invention is a unique transfer switch device. Other embodiments include unique apparatus, methods, devices, and systems involving a unique transfer switch assembly. Further objects, forms, embodiments, systems, methods, devices, apparatus, benefits, features and advantages of the present application will be, or will become apparent to one with skill in the art upon examination of the following figures and detailed description.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts throughout the different views.

DETAILED DESCRIPTION OF THE ILLUSTRATIVE EMBODIMENTS

For the purposes of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

The present invention is directed to a transfer switch assembly and a method for assembling the transfer switch assembly. In one form, the transfer switch assembly may be utilized in a land or marine vehicle, and is particularly suited to meeting the electric power needs of vehicle living spaces. For such living spaces, electrical power is typically desired for lighting, kitchen appliances, air conditioning, audio/visual equipment, or the like. The electrical power may be supplied by an engine/generator set, a storage device, or an external power source.

Figure 1:
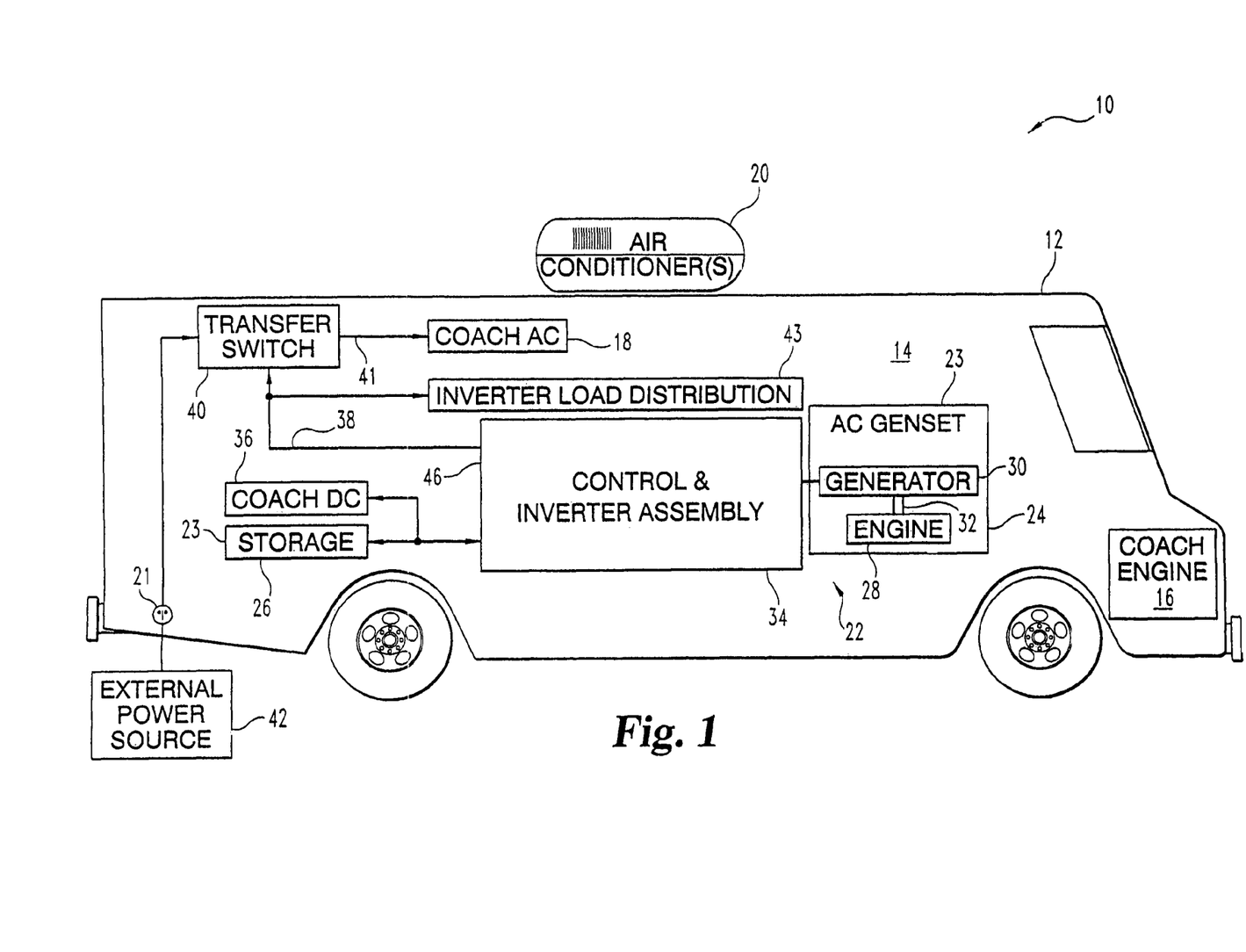
FIG. 1 is an illustrative diagrammatic view of a vehicle carrying an electric power generation system connected with a transfer switch.

Referring to FIG. 1, a vehicle 10 is illustrated in which the present invention may be utilized in the form of a motor coach 12, for illustrative purposes only. The motor coach 12 includes an interior living space 14 and is propelled by an engine 16. The engine 16 is typically of a reciprocating piston, internal combustion type. To complement the living space 14, the coach 12 carries various types of Alternating Current (AC) electrical equipment 18, such as one or more air conditioner(s) 20. The AC electrical equipment 18 may further include lighting, kitchen appliances, entertainment devices, and/or such different devices as would occur to those skilled in the art. The coach 12 also carries a mobile electric power generation system 22 to selectively provide electricity to the AC electrical equipment 18. During use, the AC electrical equipment 18 may place various electrical loads on the mobile electric power generation system 22.

The electric power generation system 22 includes two internal sources 23 of power: Alternating Current (AC) power from a genset 24 and Direct Current (DC) power from an electrical energy storage device 26. Device 26 may be one or more electrochemical cells, batteries, and/or a different electrical storage device as would occur to those skilled in the art. The genset 24 includes a dedicated engine 28 and a variable speed three-phase AC generator 30. The engine 28 provides rotational mechanical power or torque to the generator 30 with a rotary drive member 32. In one form, the engine 28 is of a reciprocating piston type, and generator 30 is of a permanent magnet alternator (PMA) type mounted on a drive shaft form of member 32 that is rotated by the engine 28. Operation of the engine 28 may be regulated via an Engine Control Module (ECM) (not shown) that is in turn responsive to control signals from a control and inverter assembly 34.

The rotational operating speed of engine 28, and correspondingly the rotational speed of the generator 30 may vary over a selected operating range in response to changes in electrical loading of the electrical equipment 18. Over this range, the rotational speed of the generator 30 increases to meet larger power demands concomitant with an increasing electrical load. The genset 24 has a steady state minimum speed at the lower extreme of this speed range corresponding to low power output and a steady state maximum speed at the upper extreme of this speed range corresponding to high power output. As the speed of the genset 24 varies, its three-phase electrical output varies in terms of AC frequency and voltage.

The genset 24 is electrically coupled to the control and inverter assembly 34. Although not specifically illustrated, the control and inverter assembly 34 includes circuitry to manage the electrical power generated and stored with the electric power generation system 22. The control and inverter assembly 34 is coupled to the storage device 26 to selectively charge it in certain operating modes and supply electrical energy from it in other operating modes. DC electric power is also supplied to one or more motor coach DC loads 36 via this connection. AC electric loads are supplied via inverter AC output bus 38. The AC output bus 38 is coupled to an AC power transfer switch assembly 40. AC electrical equipment 18 is supplied power from transfer switch 40 via power bus 41. Electric power generation system 22 also provides inverter load distribution subsystem 43 from bus 38 that does not pass through the power transfer switch 40.

As shown in FIG. 1, the power transfer switch 40 is also configured to be electrically coupled to an external AC electrical power source 42 (shore power) via interface 21. It should be appreciated that shore power generally cannot be used when vehicle 12 is in motion, may not be available in some locations; and even if available, shore power levels are typically limited by a circuit breaker or fuse. The power transfer switch 40 routes shore power to service the electrical equipment 18 as well as those supplied by an inverter load distribution subsystem 43. With the supply of external AC power from the AC electrical power source 42, the power transfer switch assembly 40 may also selectively function as a vehicle for supplying the AC shore power to assembly 34, which converts it to a form suitable to charge the electrical energy storage device 26.

Figure 2:
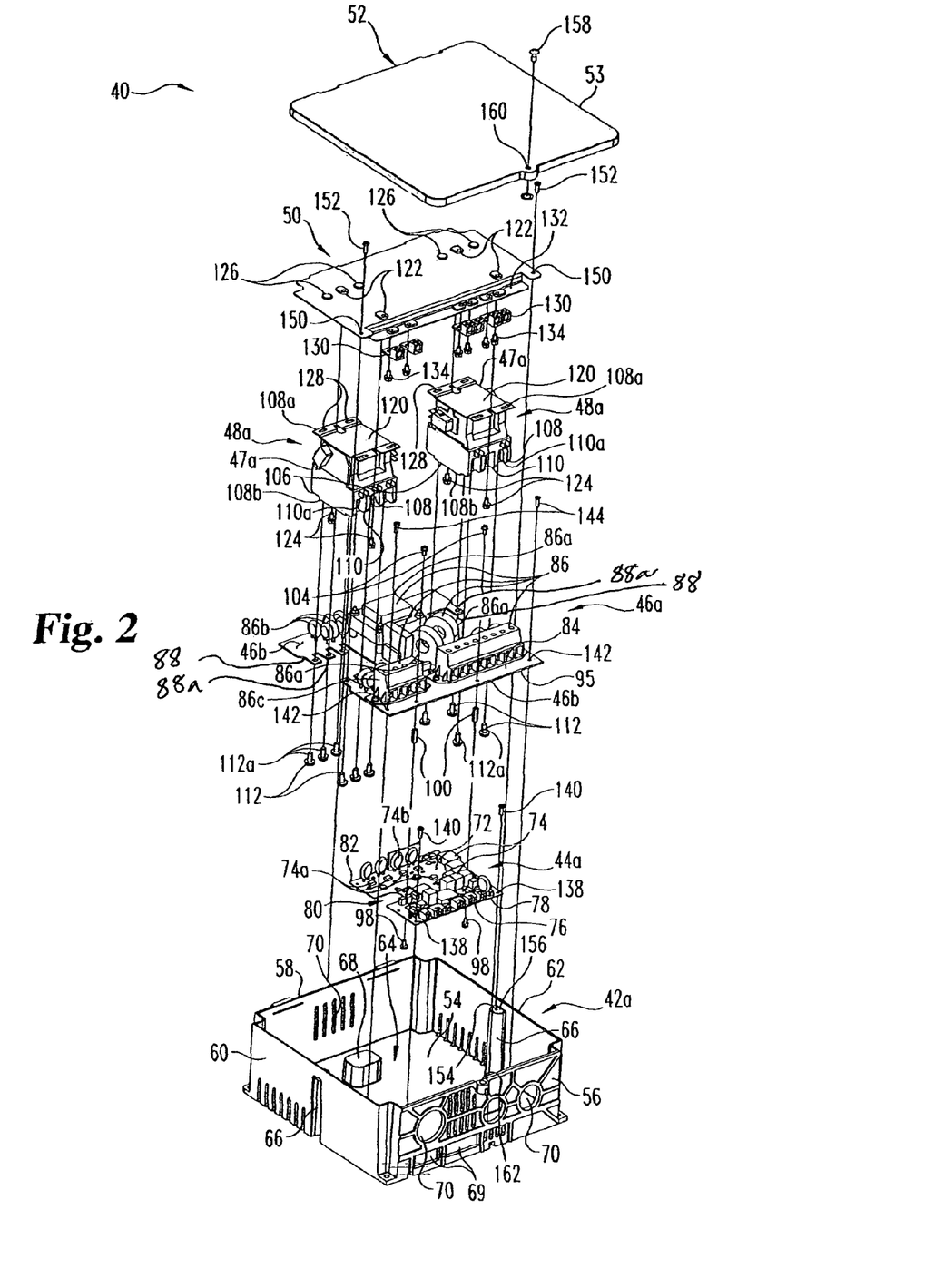
FIG. 2 is a diagrammatic view of a power transfer switch assembly.

Referring to FIG. 2, a detailed assembly diagram of an exemplary power transfer switch 40 is illustrated. The power transfer switch 40 includes an enclosure 42a, a control logic assembly 44a, a power component assembly 46a, two AC electrical power switching devices 47a in the more specific form of contactors 48a, a mounting plate 50, and an enclosure cover 52 to define a removable top wall 53. The control logic assembly 44a and the power component assembly 46a include printed circuit boards 72 and 84, respectively, having components 74 and 86 mounted thereon and carried therewith for performing specified functions. For example, the components of assembly 44a include a number of solid-state, semiconductor devices 74a as well as passive electronic components 74b. The components 86 of assembly 46a include inductors 86a, capacitors 86b, and terminal connection blocks 86c. The power transfer switch 40 is operable to allow switching between power sources (e.g.—source 23 and power source 42). The control logic assembly 44a controls operation of the transfer switch 40 and the power component assembly 46a.

As known in the art, a contactor 48a is an electric device used for switching relatively high levels of electric power. Contactors 48a are each activated by a control input which is typically a low-power signal relative to the power directed by contactor 48a. In one form, an electromagnetic device (a coil) is responsive to the control signal to mechanically move power contacts to change the contactor conductive state. One of contactors 48 connects and disconnects interface 21 to bus 41 in response to a change in state of its control signal input. The other of contactors 48 connects and disconnects source 23 to bus 41 in response to a change in state of its control signal input. Operating logic embedded in assembly 44a and/ or communicated from assembly 34 provides for an alternative switching function to route external source 42 or source 23 to bus 41.

The enclosure 42a includes a base wall 54, a front wall 56, a back wall 58, a left side wall 60, and a right side wall 62 that define an interior space of housing 64. Enclosure 42a contains assemblies 44a and 46a, devices 47a, and mounting plate 50 to provide a compact unit 40a as shown in the partially assembled view of FIG. 3 with cover 52 removed. The enclosure 42a includes a pair of side wall mounting members 66. The side wall mounting members 66 protrude inwardly into the interior space 64 a predetermined distance to provide mounting stanchions for plate 50. The base wall 54 includes a support member 68 that protrudes upwardly a predetermined distance into the interior space 64 and is positioned toward the approximate backend of the interior space 64 close to the back wall 58 on a centerline of the enclosure 42a.

The front wall 56 includes at least one connection port aperture 69, which is located at the lower left hand portion of the front wall 56 in this illustrative embodiment. In addition, the enclosure 42a includes a plurality of venting apertures 70 that allow ambient air to pass into the interior space 64 of the enclosure 42a to cool the various components housed therein. The enclosure 42a may be fabricated using a broad range of polymers or any other suitable material. Although the enclosure 42a is illustrated having a generally square shaped configuration, it should be appreciated that other configurations, such as, for example, rectangular, oval or triangular, may be used as well.

Figure 3:
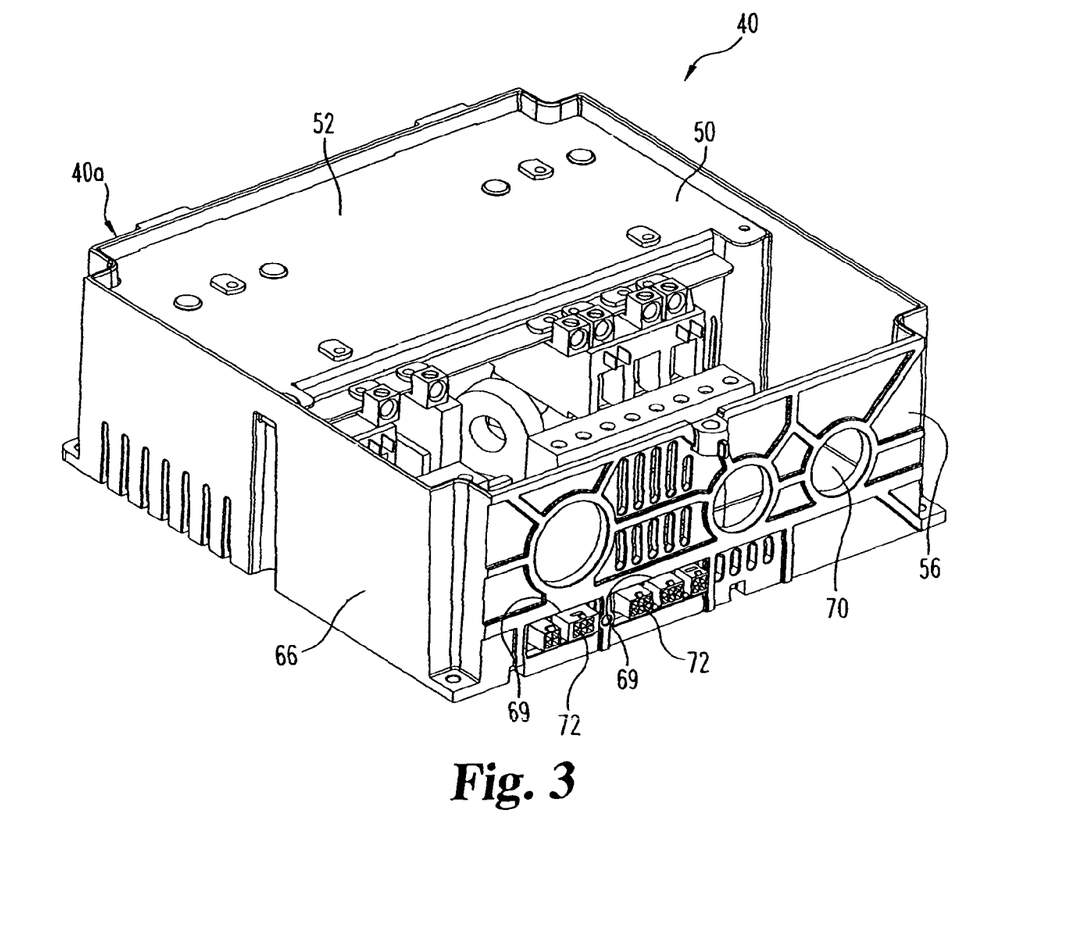
FIG. 3 is a perspective view of an assembled power transfer switch assembly without a housing cover.

As illustrated in FIGS. 2 and 3, the control logic assembly 44a includes a printed circuit board 72 that has components 74 mounted thereon. The control logic assembly 44a includes at least one connection terminal or port 76 that is located at approximately a front edge 78 of the control logic assembly 44a. The connection terminals 76 protrude outwardly a predetermined distance from the front edge 78 of the control logic assembly 44a. Referring to FIG. 3, when assembled, the connection terminals 76 extend through the terminal apertures 69 located in the front wall 56 so that an external connection may be readily made with the connection terminals 76. The control logic assembly 44a also includes a notch 80 located at a left hand side 82 of the control logic assembly 44a.

Figure 4:
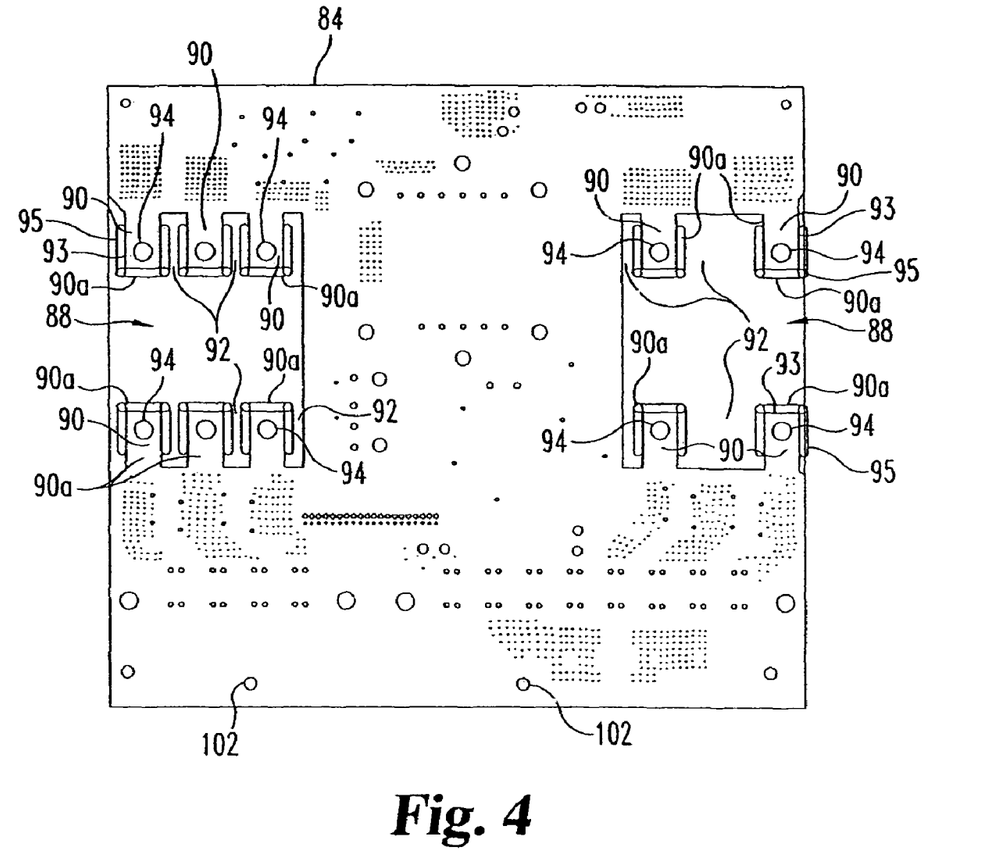
FIG. 4 depicts an illustrative view of a representative printed circuit board of the power component assembly.
Figure 5:
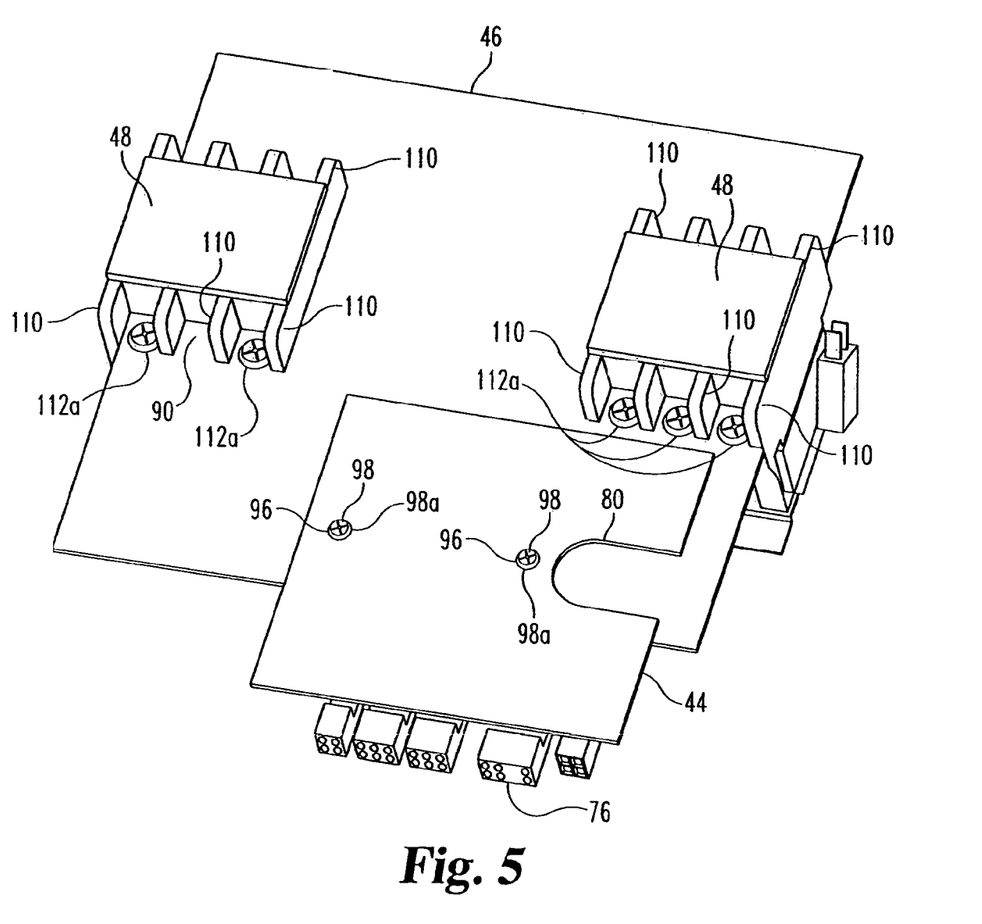
FIG. 5 is a bottom perspective view of a control logic assembly connected with a power component assembly having contacts connected thereto.

Referring to FIGS. 2 and 4, printed circuit board 84 is further illustrated prior to assembly with components 86. Board 84 includes opposing sides 46b. As illustrated in FIG. 4, the printed circuit board 84 includes two openings 88 to receive a corresponding contactor 48a therethrough. Openings 88 are each in the form of a recess, being unbounded along the terminal edge of board 84. Opening 88 is alternatively designated interstice 88a. The openings 88 are used to mount the contactors 48a to the printed circuit board 84. The openings 88 define a plurality of inwardly facing projections 90 defined by notches 92 therebetween. Projections 90 are alternatively designated tabs or fingers 90a. The inwardly facing projections 90 include apertures 94 that, as set forth in greater detail below, are designed to receive securing members that connect the contactors 48a to the printed circuit board 84 of the power component assembly 46a. Fingers 90a define the border of openings 88 and each includes an edge 93 clad with a metallic layer 95 to provide better electrical power and thermal management of switch 40. Edge 93 bears layer 95 on 3 faces of each projection 90 in the illustrated embodiment.

Referring collectively to FIGS. 2 and 4-6, the manner in which the control logic assembly 44a and the power component assembly 46a are assembled will be described in greater detail. The control logic assembly 44a is connected with the power component assembly 46a such that a portion of the control logic assembly 44a is positioned below or underneath the power component assembly 46a in a vertically stacked arrangement. In addition, another portion of the control logic assembly 44a protrudes a predetermined distance outwardly from a front edge 95a of the power component assembly 46a. Positioning a predetermined portion of the control logic assembly 44a outwardly from the front edge 95a of the power component assembly 46a can assist with positioning the connection terminals 76 through ports 69 during assembly of the power transfer switch 40.

The printed circuit board 72 of the control logic assembly 44a includes a plurality of apertures 96 through which a fastener 98, such as a screw 98a for example, passes to connect the control logic assembly 44a with the power component assembly 46a. As illustrated best in FIG. 2, a pair of standoffs 100 is positioned between the control logic assembly 44a and the power component assembly 46a to keep the respective assemblies spaced apart from one another a predetermined distance. The power component assembly 46a includes apertures 102 that receive fasteners 104. As such, the power component assembly 46a is connected on top of the control logic assembly 44a and they are spaced apart or separated from one another through the use of standoffs 100.

Figure 6:
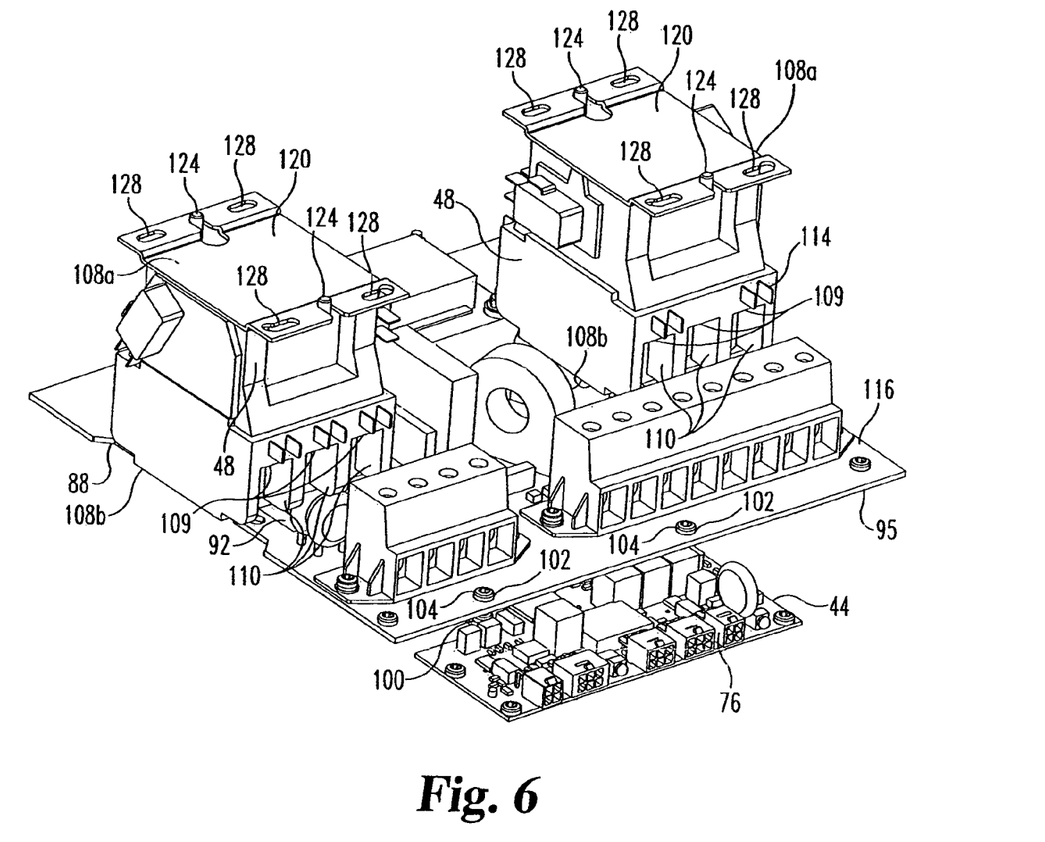
FIG. 6 is a top perspective view of an illustrative control logic assembly connected with a power component assembly having contacts connected thereto.

As previously set forth, the contactors 48a are connected with the printed circuit board 84 of the power component assembly 46a. Contactors 48a each include an end portion 108a opposite end portion 108b. Between end portions 108a and 108b, contactors 48a each include a number of platforms or landings 109 separated from one another by a respective dividing wall 110. Contactor 48a is positioned within the opening 88 of the power component assembly 46a, such that end portion 108a extends away from one side 46b of board 84 and end portion 108b extends away from the other side 46b of board 84. Protrusions 90 of the printed circuit board 84 and a plurality of dividing walls 110 of the contactors 48a are received in the notches 92 of openings 88. A plurality of fasteners 112 in the form of screws 112a are provided to secure the contactors 48a to the printed circuit board 84 of the power component assembly 46a. Each landing 109 of contactor 48a defines a threaded hole to engage a respective threaded stem of screw 112a. As illustrated in FIG. 6, outwardly extending members 114 of the contactors 48a may make contact with an upper surface 116 of the printed circuit board 84. Screws 112a each extend through one of apertures 94 such that its head bears against a corresponding projection 90 when its stem is threaded into the hole of landing 109 to provide a secure, fixed connection between contactors 48a and board 84. Accordingly, when assembled, contactors 48a effectively suspend assembly 46b (via board 84) between base wall 64 and top wall 53 for the vertical orientation depicted.

Figure 7:
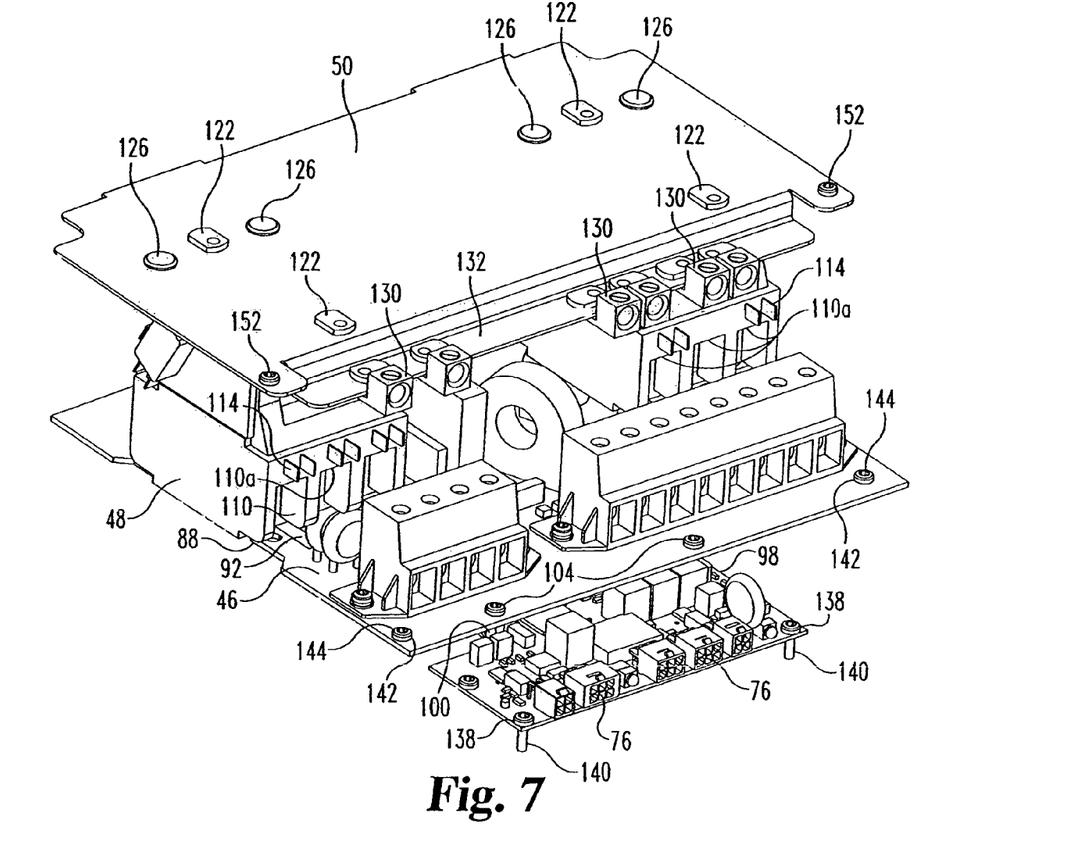
FIG. 7 depicts an illustrative transfer switch electronic assembly.

Referring to FIGS. 2, 6 and 7, a mounting plate 50 is connected with a securing plate or member 120 of the contactors 48a. The mounting plate 50 allows electrical connections to be made with the contactors 48a as well as other components. The mounting plate 50 includes a plurality of securing members 122, such as threaded bosses, that allow other securing members 124, such as screws, to firmly connect the contactors 48a with the mounting plate 50. A plurality of alignment pins 126 of the mounting plate 50 extend downwardly into apertures 128 in the securing member 120 of the contactors 48a. The mounting plate 50 also includes a plurality of lugs or connection terminals 130 that are connected with an outer front edge 132 of the mounting plate 50 with a plurality of securing members 134.

Referring to FIGS. 2, 3 and 7, once the control logic assembly 44a has been connected with the power component assembly 46a, the contactors 48a have been connected with the power component assembly 46a, and the contactors 48a have been connected with the mounting plate 50, the entire transfer switch electronic assembly 136 may be positioned within the interior space 64 of the enclosure 42a. The control logic assembly 44a may include apertures 138 that allow securing members 140 to connect the printed circuit board 72 with the enclosure 42a. For the vertical orientation shown, assembly 44a is suspended from assembly 46a, and assemblies 44a and 46a are arranged in a stacked relationship.

The power component assembly 46a includes apertures 142a that allow securing members 144a to connect the printed circuit board 84 of the power component assembly 46a to the enclosure 42a. A portion of the printed circuit board 84 of the power component assembly 46a rests on an upper surface of the upwardly protruding projection 68 of the enclosure 42a. When assembled, contactors 48a engage enclosure 42a in a direct or indirect bearing relationship to support assemblies 46a and 44a. The mounting plate 50 of the transfer switch electronic assembly 136 includes a plurality of apertures 150 for receiving securing members 152 that connect the mounting plate 50 with a pair of connection apertures 154 located on an upper surface 156 of the pair of side wall mounting members 66.

Referring to FIG. 2, once the transfer switch electronic assembly 136 has been secured in place within the interior space 64 of the enclosure 42a, the cover 52 is then placed to provide a top for enclosure 42a. The cover 52 is secured to the enclosure 42a using a securing member 158 that fits within an aperture 160 located at the front of the cover 52. The enclosure 42a includes a cover connection member 162 that receives the securing member 158 to allow the cover 52 to be securely connected with the remainder of the enclosure 42a.

A further embodiment of the present application includes a system with an interface to an external power source, a variable speed generator power source, and a power transfer switch unit. This unit is operably coupled to the interface, the generator power source, and an output bus. The power transfer switch unit is structured to switch between the external power source and the generator power source to transfer electric power to the output bus. The unit includes a contactor defining a number of landings between a first end portion and a second end portion that are each separated from one another by a corresponding one of a number of dividing walls, a printed circuit board carrying a number of power electronic devices, and an enclosure including a first enclosure wall opposite a second enclosure wall. The printed circuit board includes a first side opposite a second side and defines an opening therethrough. This opening is bordered by several paths each separated from one another by a corresponding one of several notches defined by the opening. The tabs each include an edge clad with a metallic layer. The contactor is received through the opening to place each respective one of the dividing walls through a respective one of the notches. Each respective one of the tabs is fastened to a respective one of the landings. The contactor and the printed wiring board are contained in the enclosure and at least one of the first end portion and the second end portion of the contactor engage the enclosure to position the printed wiring board between the first enclosure wall and the second enclosure wall.

Still another embodiment is directed to a power transfer switch unit including an electric power switching device defining a number of engagement landings between a first end portion and a second end portion, a printed circuit board assembly including a printed circuit board carrying a number of power electronic devices, and an enclosure containing the electric power switching device and the printed circuit board assembly therein. The printed circuit board includes a first side opposite a second side and defines an opening bordered by a number of engagement fingers. The electric power switching device is connected to the printed circuit board to extend through the opening and to engage each of the fingers with a different one of the landings. The first end portion of the electric power switching device is positioned to extend past the first side of the printed circuit board and the second end portion of the electric power switching device is positioned to extend past the second side of the printed circuit board. The enclosure includes the first wall opposite a second wall, and at least one of the first end portion and the second end portion of the switching device engages the enclosure to support the printed circuit assembly between the first wall and the second wall.

Yet a further embodiment of the present application is directed to an apparatus that comprises an electric power transfer switch unit. This unit includes a power switching device defining a number of fastening landings each separated from one another by a corresponding one of a number of divided walls, a printed circuit board assembly including a printed circuit board carrying a number of electronic devices, and a number of fasteners. The printed circuit board defines an opening therethrough that is bordered by a number of fastening fingers each separated from one another by a corresponding one of a number of notches. The fingers each include an edge clad with a metallic layer to provide thermal and electrical conductivity. The power switching device is received through the opening to engage each respective one of the fingers with a respective one of the landings and receive a respective one of the dividing walls through a respective one of the notches. The fasteners each connect the respective one of the fingers to the respective one of the landings.

Any theory, mechanism of operation, proof, or finding stated herein is meant to further enhance understanding of the present invention and is not intended to make the present invention in any way dependent upon such theory, mechanism of operation, proof, or finding. It should be understood that while the use of the word preferable, preferably or preferred in the description above indicates that the feature so described may be more desirable, it nonetheless may not be necessary and embodiments lacking the same may be contemplated as within the scope of the invention, that scope being defined by the claims that follow. In reading the claims it is intended that when words such as "a," "an," "at least one," "at least a portion" are used there is no intention to limit the claim to only one item unless specifically stated to the contrary in the claim. Further, when the language "at least a portion" and/or "a portion" is used the item may include a portion and/or the entire item unless specifically stated to the contrary. While the invention has been illustrated and described in detail in the drawings and foregoing description, the same is to be considered as illustrative and not restrictive in character, it being understood that only the selected embodiments have been shown and described and that all changes, modifications and equivalents that come within the spirit of the invention as defined herein or by any of the following claims are desired to be protected.

What is claimed is:

1. A system, comprising:
    an interface to an external power source;
    a variable speed generator power source; and
    a power transfer switch unit operatively coupled to the interface, the generator power source, and an output power bus, the power transfer switch unit being structured to switch between the external power source and the generator power source to transfer electric power to the output power bus, the power transfer switch unit including:
    a contactor defining a number of landings between a first end portion and a second end portion, the landings each being separated from one another by a corresponding one of a number of dividing walls;
    a printed circuit board carrying a number of power electronic devices, the printed circuit board including a first side opposite a second side and defining an opening therethrough, the opening being bordered by several tabs each separated from one another by a corresponding one of several notches, the tabs each including an edge clad with a metallic layer, the contactor being received through the opening to place each respective one of the dividing walls through a respective one of the notches, each respective one of the tabs being fastened to a respective one of the landings; and
    an enclosure including a first enclosure wall opposite a second enclosure wall, the contactor and the printed circuit board being contained in the enclosure and at least one of the first end portion and the second end portion engaging the enclosure to position the printed circuit board between the first enclosure wall and the second enclosure wall.

2. The system of claim 1, further comprising a vehicle carrying the interface, the generator power source, and the power transfer switch unit.

3. The system of claim 1, wherein the power transfer switch unit includes another contactor fixed to the printed circuit board and extending through another opening in the printed circuit board to bear against the enclosure.

4. The system of claim 1, further comprising means for stacking the printed circuit board next to another printed circuit board in a spaced apart relationship within the enclosure and between the first wall and the second wall.

5. The system of claim 1, wherein the tabs each include an aperture, the landings each include a threaded hole, and the tabs are each fastened to the landings by a respective one of a number of screws.

6. The system of claim 1, wherein the electric power devices include a number of inductors, a number of capacitors, and one or more terminal block devices and further comprising another printed circuit carrying a number of solid state components.

7. An apparatus, comprising a power transfer switch unit including:
    an electric power switching device defining a number of engagement landings between a first end portion and a second end portion;
    a printed circuit board assembly including a printed circuit board carrying a number of power electronic devices, the printed circuit board including a first side opposite a second side and defining an opening bordered by a number of engagement fingers, the electric power switching device being connected to the printed circuit board to extend through the opening and to engage each of the fingers with a different one of the landings, the first end portion of the electric power switching device being positioned to extend past the first side of the printed circuit board and the second end portion of the electric power switching device being positioned to extend past the second side of the printed circuit board; and
    an enclosure containing the electric power switching device and the printed circuit board assembly therein, the enclosure including a first wall opposite a second wall, at least one of the first end portion and the second end portion bearing against the enclosure to support the printed circuit assembly between the first wall and the second wall.

8. The apparatus of claim 7, further comprising a vehicle carrying a variable speed generator power source and an interface to selectively connect to a shore power source, the power transfer switch unit being connected to a power bus and structured to select between the shore power source and the generator power source to transfer electrical power to the power bus.

9. The apparatus of claim 7, wherein each respective one of the fingers is connected to a different one of the landings by a respective one of a number of fasteners.

10. The apparatus of claim 9, wherein the fingers each define an aperture, the landings each define a threaded hole, and the fasteners are each in the form of a screw extending through the aperture of the respective one of the fingers and engaging the threaded hole of the respective one of the landings.

11. The apparatus of claim 7, further comprising means for fastening the fingers to the landings.

12. The apparatus of claim 7, further comprising means for suspending the printed circuit assembly from the electric power switching device.

13. The apparatus of claim 7, further comprising a contactor extending through another opening in the printed circuit board, the contactor including a number of dividing walls separating the landings from one another, and the opening defining a number of notches each separating the fingers from one another, the notches each being sized and shaped to receive a corresponding one of the dividing walls therethrough.

14. The apparatus of claim 7, wherein the electric power switching device is a contactor, and further comprising another printed circuit board carrying a number of semiconductor devices with means for stacking in relation to the printed circuit board assembly.

15. The apparatus of claim 14, wherein the fingers each include an edge clad with a metallic layer.

16. An apparatus, comprising an electric power transfer switch unit including:
a power switching device defining a number of fastening landings each separated from one another by a corresponding one of a number of dividing walls;
a printed circuit board assembly including a printed circuit board carrying a number of electrical power devices, the printed circuit board defining an opening therethrough, the opening being bordered by a number of fastening fingers each separated from one another by a corresponding one of a number of notches, the fingers each including an edge clad with a metallic layer to provide thermal and electrical conductivity, the power switching device being received through the opening to engage each respective one of the fingers with a respective one of the landings and receive a respective one of the dividing walls through a respective one of the notches; and
a number of fasteners each connecting the respective one of the fingers to the respective one of the landings.

17. The apparatus of claim 16, further comprising an enclosure including a first wall opposite a second wall, the power switching device including a first end portion opposite a second end portion, and at least one of the first end portion and the second end portion engaging the enclosure to support the printed circuit assembly between the first wall and the second wall.

18. The apparatus of claim 16, further comprising a vehicle carrying a variable speed generator power source and an interface to selectively connect to a shore power source, the power transfer switch unit being connected to a power bus and structured to select between the shore power source and the generator power source to transfer electrical power to the power bus.

19. The apparatus of claim 16, wherein the fingers each define an aperture, the landings each define a threaded hole, and the fasteners are each in the form of a screw extending through the aperture of the respective one of the fingers and engaging the threaded hole of the respective one of the landings.

20. The apparatus of claim 16, further comprising means for suspending the printed circuit assembly from the electric power switching device.

21. The apparatus of claim 16, further comprising a contactor extending through another opening in the printed circuit board.

22. The apparatus of claim 16, wherein the power switching device is a contactor, and further comprising another printed circuit board carrying a number of semiconductor devices with means for stacking in relation to the printed circuit board assembly.

* * * * *